(12) United States Patent
Li et al.

(10) Patent No.: US 10,855,273 B2
(45) Date of Patent: Dec. 1, 2020

(54) HIGH-SIDE GATE DRIVER FOR GALLIUM NITRIDE INTEGRATED CIRCUITS

(71) Applicants: Zhanming Li, West Vancouver (CA); Yan-Fei Liu, Kingston (CA); Yue Fu, Coquitlam (CA); Wai Tung Ng, Thornhill (CA)

(72) Inventors: Zhanming Li, West Vancouver (CA); Yan-Fei Liu, Kingston (CA); Yue Fu, Coquitlam (CA); Wai Tung Ng, Thornhill (CA)

( * ) Notice: Subject to any disclaimer, the term of this patent is extended or adjusted under 35 U.S.C. 154(b) by 0 days.

(21) Appl. No.: 16/423,138

(22) Filed: May 27, 2019

(65) Prior Publication Data

US 2019/0379374 A1 Dec. 12, 2019

Related U.S. Application Data

(60) Provisional application No. 62/682,542, filed on Jun. 8, 2018.

(51) Int. Cl.
*H03K 17/30* (2006.01)
*H03K 17/22* (2006.01)
*H03K 17/06* (2006.01)

(52) U.S. Cl.
CPC ............ *H03K 17/30* (2013.01); *H03K 17/063* (2013.01); *H03K 17/223* (2013.01); *H01L 2924/1033* (2013.01)

(58) Field of Classification Search
CPC .... H03K 17/30; H03K 17/063; H03K 17/223; H03K 17/302; H03K 17/162; H03K 17/691; H03K 2017/0063; H01L 27/0605; H01L 2924/1033
See application file for complete search history.

(56) References Cited

U.S. PATENT DOCUMENTS

| | | | |
|---|---|---|---|
| 9,537,338 B2 * | 1/2017 | Kinzer | H01L 27/088 |
| 10,205,447 B1 * | 2/2019 | Ribarich | H03K 17/691 |
| 10,333,408 B1 * | 6/2019 | Knoedgen | H02M 3/1584 |
| 2020/0028437 A1 * | 1/2020 | Sharma | H02M 3/1588 |

* cited by examiner

*Primary Examiner* — Jung Kim (57) ABSTRACT

A gate driver circuit for a gallium nitride (GaN) power transistor includes a RS-flipflop that receives a first pulse train at an S input terminal and a second pulse train at an R input terminal, and produces an output pulse train, and an amplifier that amplifies the output pulse train and produces a gate driver signal for the GaN power transistor. The RS-flipflop and the amplifier may be implemented together on a GaN monolithic integrated circuit, optionally together with the GaN power transistor. The GaN power transistor may be a high-side switch of a half-bridge circuit. The RS-flipflop may be implemented with enhancement mode and depletion mode GaN high electron mobility transistors (HEMTs). Embodiments avoid drawbacks of prior hybrid (e.g., silicon-GaN) approaches, such as parasitic inductances from bonding wires and on-board metal traces, especially at high operating frequencies, as well as reduce implementation cost and improve performance.

8 Claims, 11 Drawing Sheets

HIGH-SIDE GATE DRIVER FOR GALLIUM NITRIDE INTEGRATED CIRCUITS

RELATED APPLICATION

This application claims the benefit of the filing date of Application No. 62/682,542, filed on Jun. 8, 2018, the contents of which are incorporated herein by reference in their entirety.

FIELD

This invention relates generally to gallium nitride (GaN) devices. More specifically, the invention relates to gate drivers for GaN power transistors, and implementations on GaN integrated circuits.

BACKGROUND

Gallium nitride (GaN) is widely regarded as the next-generation semiconductor material for power electronic devices with high efficiency and high power density. The ability to switch at higher frequency than materials such as silicon enables the use of smaller on-board passive components, with the benefit of a reduction in parasitic losses and costs. Although discrete GaN power devices have already shown superior device performance, the majority of the peripheral control/drive functional blocks are implemented with separate chips based on silicon technology. Such a hybrid drive solution will inevitably be challenged by the parasitic inductances from bonding wires and on-board metal traces, especially at high operating frequencies. Also, the hybrid drive system requires extra discrete components for isolation and gate driving, which require more space on the printed circuit board (PCB) and increases cost.

SUMMARY

One aspect of the invention relates to a gate driver circuit for a gallium nitride (GaN) power transistor, comprising: a RS-flipflop that receives a first pulse train at an S input terminal and a second pulse train at an R input terminal, and produces an output pulse train; an amplifier that amplifies the output pulse train and produces a gate driver signal for the GaN power transistor.

In one embodiment the RS-flipflop and the amplifier are implemented together on a GaN monolithic integrated circuit.

In one embodiment the amplifier comprises one or more stages; wherein each stage of the one or more stages is a direct-coupled FET logic (DCFL) amplifier.

In one embodiment each stage of the one or more stages of the DCFL amplifier comprises: a first stage input point, a first stage output point, a second stage high side input point, a second stage low side input point, and an amplifier output point; wherein the first stage input point is connected to a first stage and to the second stage high side input point; and wherein the first stage output point is connected to the second stage low side input point.

In one embodiment the GaN power transistor is implemented together with the RS-flipflop and the amplifier on the GaN monolithic integrated circuit.

In one embodiment the GaN power transistor is co-packaged with the RS-flipflop and the amplifier.

In one embodiment the GaN power transistor is a high-side switch of a half-bridge circuit.

In one embodiment the RS-flipflop is implemented on a GaN monolithic integrated circuit; wherein the RS-flipflop comprises: four EHEMTs and two DHEMTs; wherein a first two EHEMTs are of a large channel width and are arranged back-to-back as main RS-flipflop transistors; wherein a second two EHEMTs are of a small channel width and are arranged as R and S input transistors; wherein the two DHEMTs are configured as non-linear loads for the main RS-flipflop transistors.

In one embodiment a ratio of transistor channel widths for the two EHEMTs of a large channel width, the two EHEMTs of a small channel width, and the two DHEMTs is 100:30:1, respectively, wherein each value in the ratio is independently variable by plus or minus 50 percent.

Embodiments may further comprise a device that outputs the first pulse train and the second pulse train; wherein a pulse width of the first pulse train is within a range of about 5 ns to 15 ns; and wherein a pulse width of the second pulse train is within a range of about 5 ns to 15 ns.

Embodiments may further comprise a first transformer that couples the first pulse train to the S input terminal of the RS-flipflop; and a second transformer that couples the second pulse train to the R input terminal of the RS-flipflop.

In one embodiment, magnetizing inductance ratios for the first transformer and for the second transformer are about 7 $\mu$H:7 $\mu$H for a 10 ns pulse width; wherein the magnetizing inductance ratios for the first transformer and for the second transformer are independently variable by plus or minus 50 percent.

Another aspect of the invention relates to a GaN monolithic integrated circuit comprising a gate driver for a GaN power transistor, comprising: a RS-flipflop; an amplifier; and the GaN power transistor.

Another aspect of the invention relates to a method for implementing a gate driver circuit for a GaN power transistor, comprising: using a RS-flipflop to receive a first pulse train at an S input terminal, receive a second pulse train at an R input terminal, and produce an output pulse train; amplifying the output pulse train to produce a gate driver signal for the GaN power transistor.

In one embodiment the method comprises implementing the RS-flipflop and the amplifier together on a GaN monolithic integrated circuit.

In one embodiment the method comprises implementing the GaN power transistor together with the RS-flipflop and the amplifier on the GaN monolithic integrated circuit.

In one embodiment the method comprises co-packaging the GaN power transistor with the RS-flipflop and the amplifier.

In one embodiment the GaN power transistor is a high-side switch of a half-bridge circuit.

In one embodiment the method comprises implementing the RS-flipflop on a GaN monolithic integrated circuit; wherein the RS-flipflop comprises: four EHEMTs and two DHEMTs; wherein a first two EHEMTs are of a large channel width and are arranged back-to-back as main RS-flipflop transistors; wherein a second two EHEMTs are of a small channel width and are arranged as R and S input transistors; wherein the two DHEMTs are configured as non-linear loads for the main RS-flipflop transistors.

In one embodiment a ratio of transistor channel widths for the two EHEMTs of a large channel width, the two EHEMTs of a small channel width, and the two DHEMTs is 100:30:1, respectively, wherein each value in the ratio is independently variable by plus or minus 50 percent.

In one embodiment a pulse width of the first pulse train is within a range of about 5 ns to 15 ns, and a pulse width of the second pulse train is within a range of about 5 ns to 15 ns.

In one embodiment the method comprises using a first transformer to couple the first pulse train to the S input terminal of the RS-flipflop; and using a second transformer to couple the second pulse train to the R input terminal of the RS-flipflop.

In one embodiment, magnetizing inductance ratios for the first transformer and for the second transformer are about 7 µH:7 µH for a 10 ns pulse width; wherein the magnetizing inductance ratios for the first transformer and for the second transformer are independently variable by plus or minus 50 percent.

Another aspect of the invention relates to a switching mode power system including a control and gate driver circuit for the high-side switch of a half bridge, wherein two narrow pulse trains are coupled through two micro transformers to trigger a RS-flipflop, wherein an output of the RS-flipflop is used as an input to an amplifier of the gate driver to the high-side power transistor.

According to embodiments described herein, the high-side power transistor may be a GaN power transistor.

According to embodiments described herein, the amplifier and the high-side power transistor are combined in a single chip, such as a GaN monolithic integrated circuit, or are co-packaged into a single device.

In one embodiment, the RS-flipflop is included in the single chip, such as a GaN monolithic integrated circuit, or is included in the single device using co-packaging.

In one embodiment, the RS-flipflop is monolithically integrated and includes four EHEMTs and two DHEMTs; wherein a first two of the EHEMTs are of a large channel width and arranged back-to-back as main flipflop transistors; wherein a second two of the EHEMTs are of a smaller channel width and arranged as input transistors; wherein the two DHEMTs are configured as a non-linear load and are of the smallest channel width in the RS-flipflop.

In one embodiment, the two EHEMTs that are of a large channel width include two metal layers wherein a source electrode is located below a drain electrode; wherein two RS-flipflop transistors with side gate-bars face each other; wherein one of the side gate-bars has an open top portion to allow a metal connection through the gate-bar, and the other side gate-bar has an open middle portion to achieve a through connection.

In one embodiment, the second two EHEMTs are arranged so that one said EHEMT is located with its drain directly below the gate-bars of the first two EHEMTS, and the other said EHEMT is oriented vertically so that both sides have sufficient space to allow ground lines to pass through.

In one embodiment, the two DHEMTs are arranged with one oriented horizontally to allow an auxiliary power supply voltage line to pass above and through the horizontal one.

In one embodiment, the EHEMTs and DHEMTs are configured with drain electrodes below the source and arrangement of the transistors is rotated by 180 degrees.

In one embodiment, a ratio of transistor channel width for the first two EHEMTs, the second two EHEMTS, and the two DHEMTS is 100:30:1, with each value in the ratio variable by plus or minus 50 percent.

In one embodiment, values of input capacitors and micro-transformers are 0.2 nF and 7 µH:7 µH for a 10 ns pulse, with plus or minus 50 percent adjustment for each of the three parameters.

BRIEF DESCRIPTION OF THE DRAWINGS

For a better understanding of the invention, and to show more clearly how it may be carried into effect, embodiments will be described, by way of example, with reference to the accompanying drawings, wherein:

FIG. 58 is the schematic diagram.

DETAILED DESCRIPTION OF EMBODIMENTS

One aspect of the invention relates to a gate driving circuit that is suitable for monolithic integration using GaN technology. According to this aspect, integrated circuits may be implemented entirely in GaN, without the need to implement peripheral control and/or drive functional blocks in a different technology such as silicon. Integrated circuits implemented in GaN as described herein avoid drawbacks, such as parasitic inductances from bonding wires and on-board metal traces, especially at high operating frequencies, of such prior hybrid technologies, as well as reduce implementation cost and improve performance.

Figure 1:
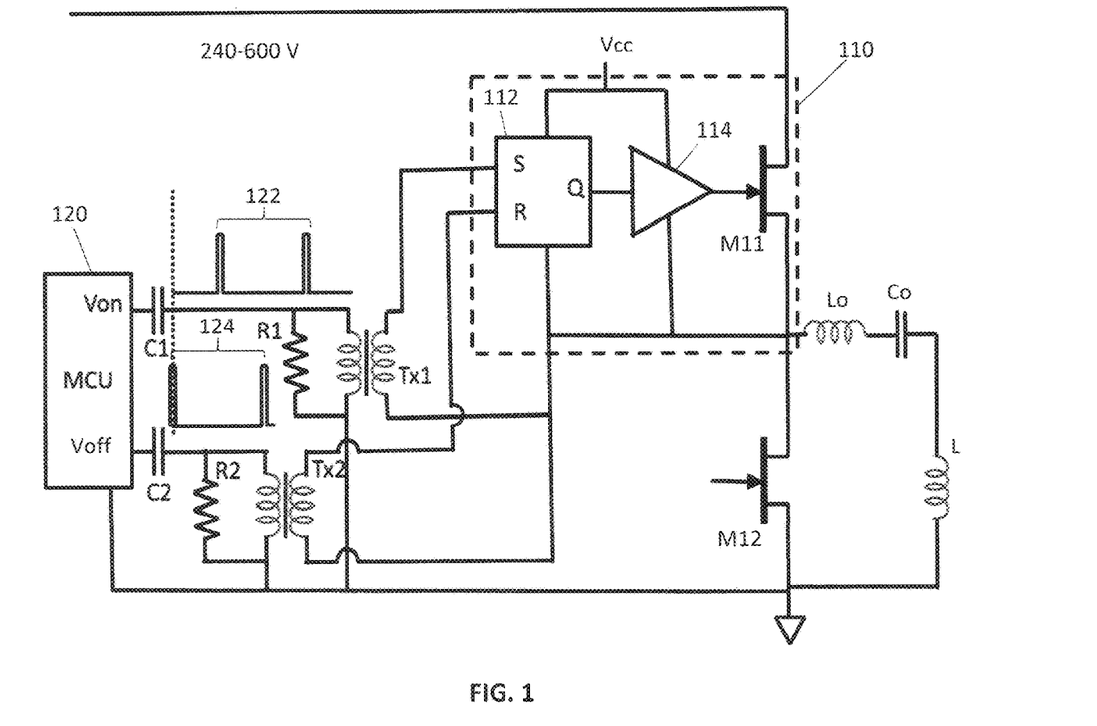
FIG. 1 is a schematic diagram showing a high-side gate driver circuit for a GaN power transistor, according to one embodiment.

In one embodiment, the gate driving circuit is for a GaN power transistor. The GaN power transistor may be the high-side or main switch of a half-bridge switching circuit. FIG. 1 shows such an embodiment. In this embodiment, the gate driving circuit includes an RS-flipflop 112 and amplifier 114, which drives the gate of the high-side power transistor M11. Various implementations in a GaN monolithic integrated circuit (IC) are possible. For example, the RS-flipflop alone, or the RS-flipflop together with the amplifier, or the RS-flipflop, amplifier, and GaN power transistor may be implemented on the GaN monolithic IC. In FIG. 1, the dashed line shows the RS-flipflop, amplifier, and GaN power transistor M11 implemented on a GaN monolithic IC 110. In other embodiments, various components such as one or more of the RS-flipflop, amplifier, and GaN power transistor may be implemented separately in GaN and co-packaged together.

The embodiment of FIG. 1 includes a microcontroller unit (MCU) 120 or other suitable device (e.g., a pulse-width modulator (PWM)) to generate pulse trains 122, 124 which are coupled through two transformers Tx1 and Tx2, and used to trigger the RS-flipflop 112. The two pulse trains are out of phase. For example, in one embodiment the phase difference of the two pulse trains may be 180 degrees. In other embodiments, other phase differences may be used. The phase difference may be selected based on the duty cycle of the pulse. The pulse trains may each have a frequency of about 100 kHz to 30 MHz, and an amplitude of about 3 to 15 V. The RS-flipflop output Q is the input to the amplifier 114 which drives the main GaN power transistor M11. In this embodiment the low side GaN power transistor M12 is not implemented in the GaN integrated circuit 110. However, in other embodiments the low-side GaN power switch may also be implemented in the monolithic IC, or it may be co-packaged with the driver and high-side GaN power switch.

As used herein, the terms "transistor" and "switch" are considered to be equivalent, and are used interchangeably.

One aspect of the embodiment of FIG. 1 is the use of two transformers (Tx1 and Tx2) to trigger the RS-flipflop 112 which is implemented in the GaN power integrated circuit (IC) 110. The two transformers transfer the pulse train signals to the gate driver, and also provide the needed isolation (or level shifting) for the high-side of the half-bridge circuit. Use of a narrow pulse width, for example, 10 ns, plus or minus about 50%, makes it possible to use small transformers which require less area on the printed circuit board (PCB) and are less expensive.

According to the embodiment of FIG. 1, the RS-flipflop 112, amplifier 114, and main GaN power transistor M11 are monolithically integrated. In other embodiments, other components may also be included in the monolithic IC. Implementation of the RS-flipflop in the GaN IC is based on enhancement mode (E-mode) and depletion mode (D-mode) high electron mobility transistor (HEMT) technology. One embodiment of the RS-flipflop is shown in the schematic diagram of FIG. 2, together with an amplifier 114 and GaN power transistor M11.

Figure 2:
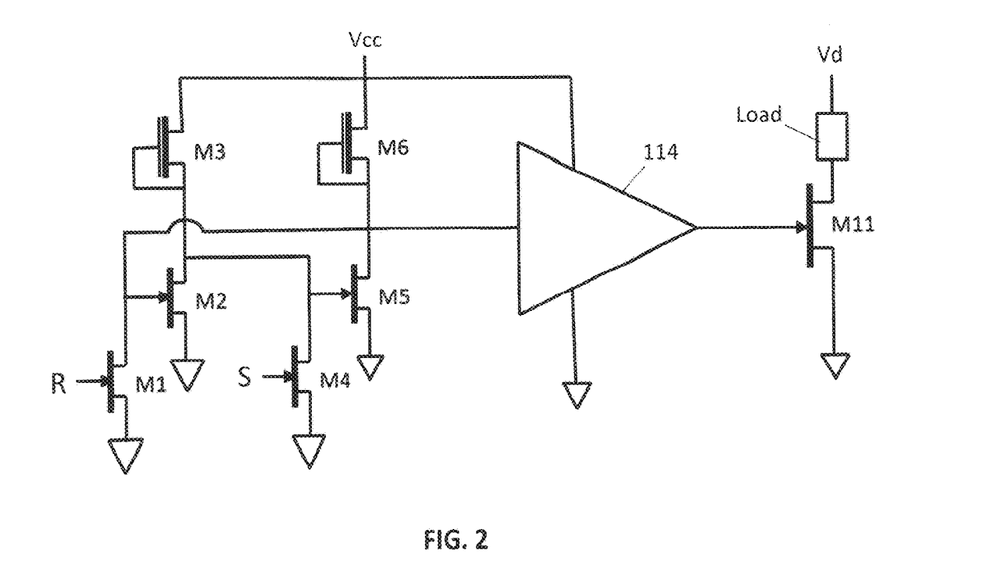
FIG. 2 is a schematic diagram of an RS-flipflop implemented in GaN E-mode and D-mode high electron mobility transistors (HEMTs), according to one embodiment.

In FIG. 2, E-mode HEMTs (EHEMTs) M2 and M5 are the two main transistors connected back to back. M1 and M4 are two small EHEMTs connected as input isolators for the R and S inputs, respectively. As used herein, the terms "small" and "large" as applied to EHEMTs and DHEMTs ("HEMTS") refer to the width of the gate or channel. For example, a small HEMT may have a channel width up to about 20 microns, and a large HEMT may have a channel width of 200-2000 microns. M3 and M6 are two DHEMTs connected so that the non-linear saturation velocity of the 2-dimensional electron gas (2DEG) can be used as a variable load. The size of M3 and M6 must be carefully selected so that proper loading is provided to M2 and M5, respectively. By "proper loading", it is meant that the effective resistances of M3 and M6 must be much larger than those of M2 and M5. M3 and M6 are selected to be similar in size, e.g., less than 50 percent different.

As an example, an embodiment may be implemented in a 650V GaN-on-silicon process, wherein E-mode is achieved using a p-GaN layer. It will be appreciated that E-mode may also be achieved using other approaches, such as deep etching of an AlGaN layer above channel.

Figure 3:
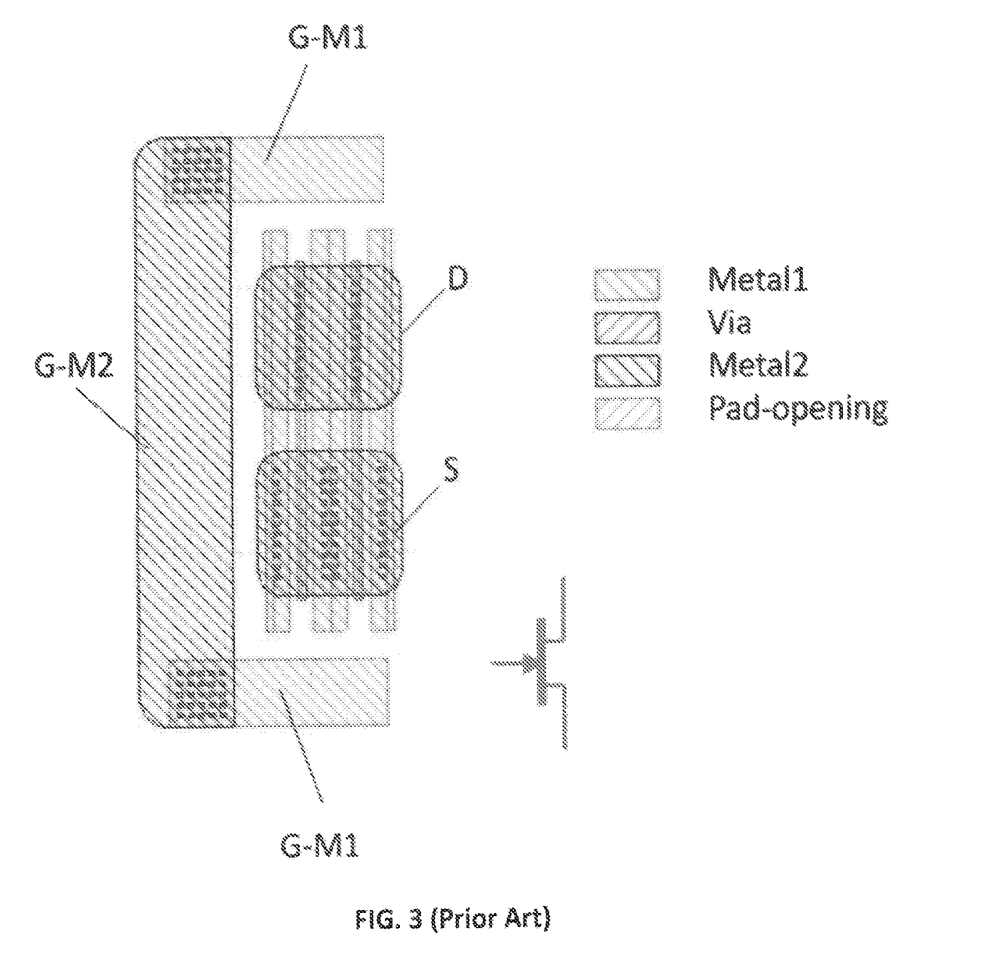
FIG. 3 is a diagram showing a layout of a GaN E-mode HEMT according to the prior art.

In one embodiment, a two-metal layer process may be used. As an example, a layout of a an EHEMT according to the prior art is shown in FIG. 3, which may conveniently be used for the EHEMTs in the embodiments described herein (e.g., M1, M4). Other layouts are of course possible. The legend shows various layers of the fabrication process, wherein Metal1 and Metal2 are the two top metal layers above the device, used for making electrodes; Via is an opening through the insulating layers between Metal1 and Metal2 layers which is filled with metal for the purpose connecting Metal1 and Metal2; and Pad-opening is an opening of the top protective coating through which electrode contacts are made. According to the layout of FIG. 3, the gate metal can be accessed through the Metal1 and Metal2 layers (G-M1 and G-M2). The source and drain can only be accessed using the G-M2 metal layer.

Figure 4:
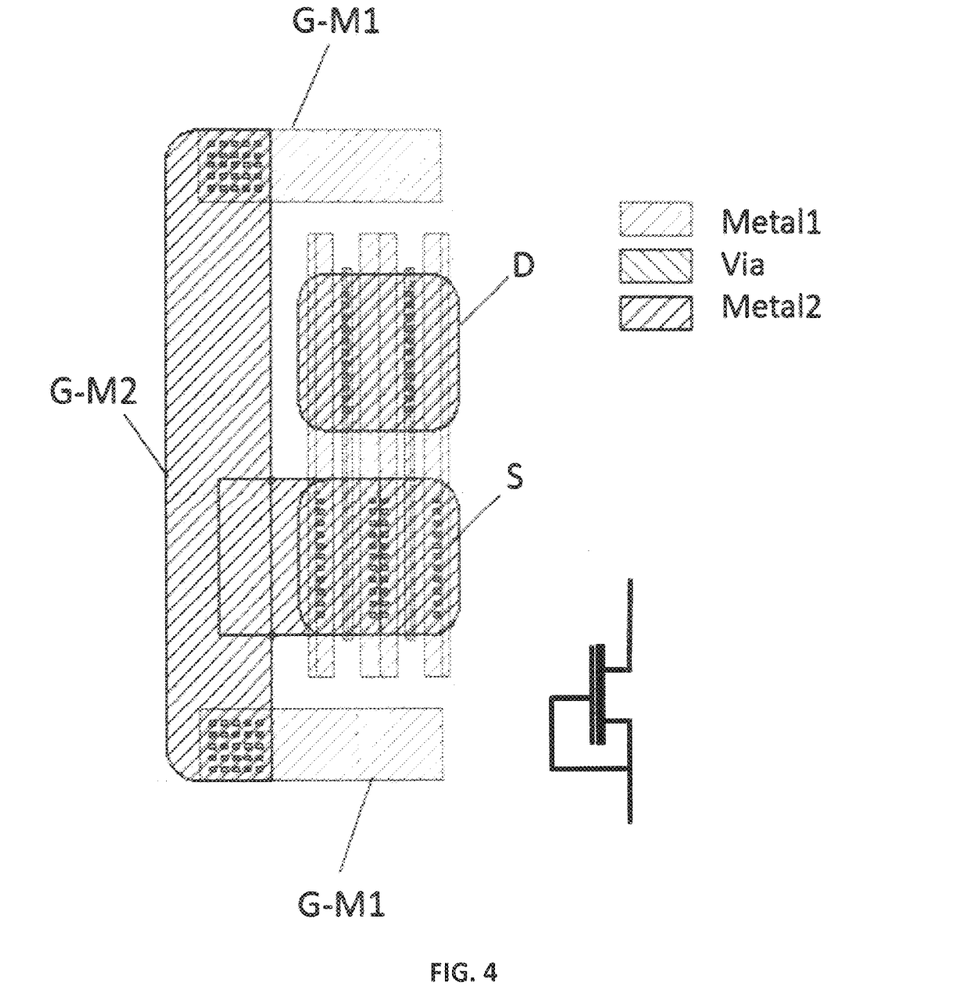
FIG. 4 is a diagram showing a layout of a D-mode HEMT in a two layer metal process, according to one embodiment.

An example of a layout for a D-mode HEMT is shown in FIG. 4, where the gate is shorted to the source for the purpose of providing a stable bias for the conduction channel. This layout may conveniently be used for the DHEMTs in the embodiments described herein (e.g., M3, M6). Other layouts are of course possible. During the fabrication process the p GaN step is omitted to achieve the natural D-mode operation for the HEMT. The legend is as described for FIG. 3.

Figure 5A:
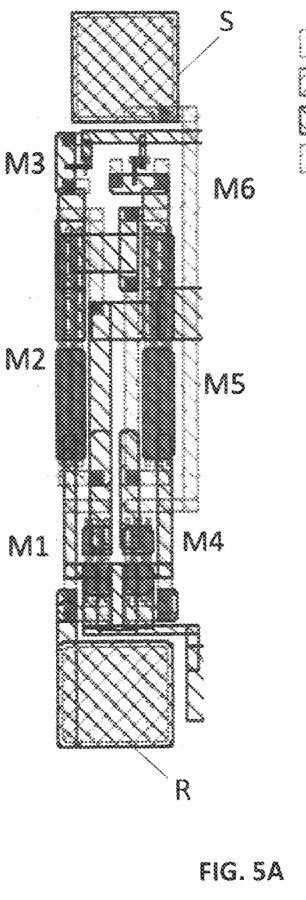
FIG. 5A is a diagram showing a layout of an RS-flipflop, according to one embodiment.
Figure 5B:
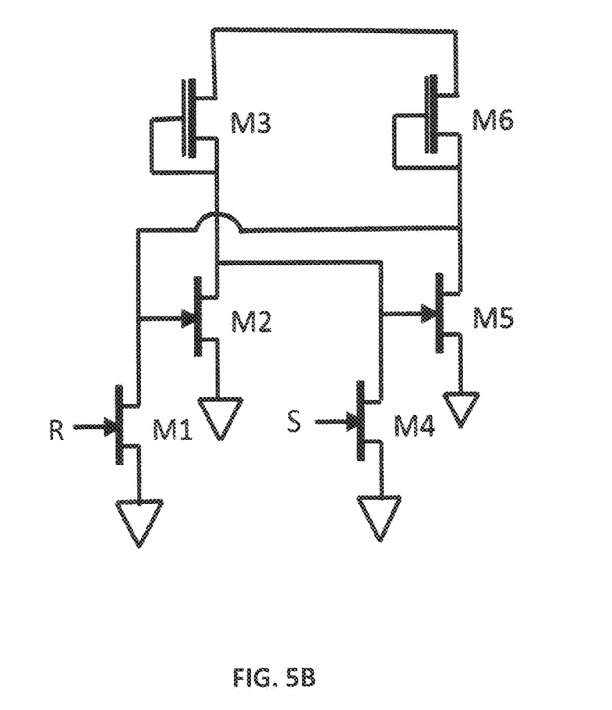

FIG. 5A shows a layout of the six transistors of the RS-flipflop, according to one embodiment, and FIG. 58 shows the schematic diagram. The legend is as described for FIG. 3. In this embodiment, the two input pads R, S corresponding to the gates of switches M1 and M4, respectively, are placed at opposite ends of the layout (i.e., on the top and bottom of the unit in FIG. 5A) to provide separate locations for ease of packaging. It is noted that this embodiment achieves two important design features: no crossing of the two metal layers and space-saving in a compact manner.

Figure 6A:
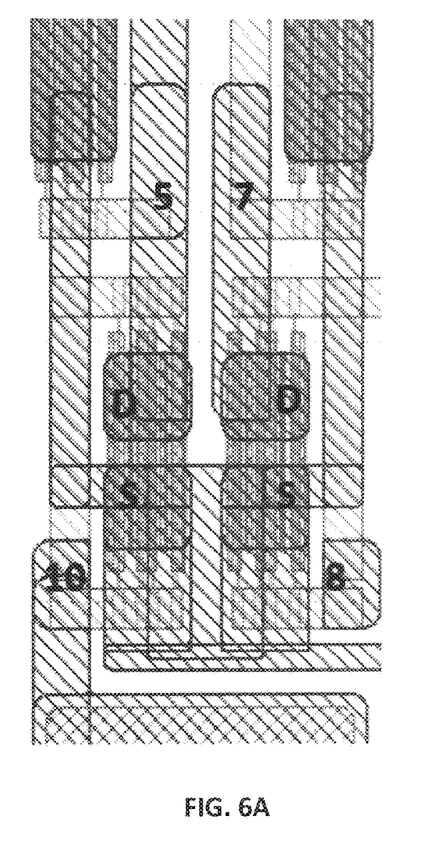
FIG. 6A is a diagram showing details of the layout of two input E-mode transistors of the RS-flipflop of FIG. 5A.
Figure 6B:
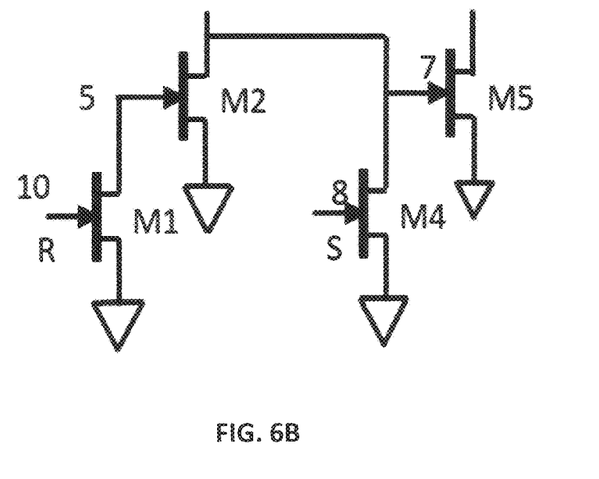
FIG. 6B is the schematic diagram.

A close-up view of the two input transistor (M1, M4) layout from FIG. 5A is shown in FIG. 6A, and FIG. 6B shows the schematic diagram. It can be seen that M1 and M4, which are the two small size EHEMTs, are placed below the main RS-flipflop transistors to occupy less space while avoiding metal line crossing. The drains of the input transistors M1 and M4 are placed directly under the gates of the main RS-flipflop transistors. Such a placement allows space on both sides to be used for the ground lines connecting the sources of the RS-flipflop transistors M2, M5 to the sources of the input EHEMTs M1, M4, before connecting to the ground line.

Figure 7A:
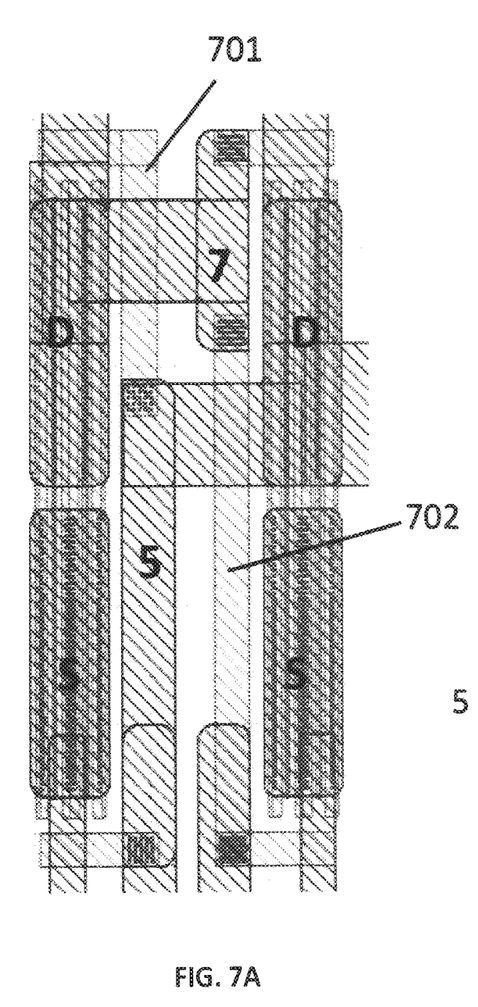
FIG. 7A is a diagram showing details of the layout of two main E-mode transistors of the RS-flipflop of FIG. 5A.
Figure 7B:
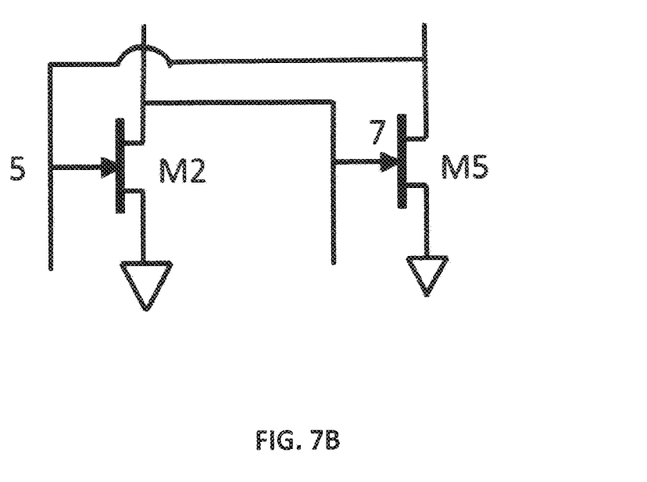
FIG. 7B is the schematic diagram.

A close-up view of the main RS-flipflop transistor M2, M5 layout from FIG. 5A is shown in FIG. 7A, and FIG. 78 shows the schematic diagram. It can be seen that the gate Metal2 of EHEMT M2 on the left side is located on the right side of the EHEMT, and similarly on the right side for EHEMT M5, so that gates of the two RS-flipflop transistors face each other. To avoid line crossing, the Metal2 of the gate is opened up to allow the output (drain) of each transistor to connect to the input (gate) of the other transistor. Since the gate Metal2 of the transistors M2, M5 must be connected to the drains of the input transistors M1 and M4 below, an area of the gate metal bars must be opened up for connection. That is, in FIG. 7A, an area in the top 701 of the left gate-bar (M2) is opened up and an area in the middle 702 of the right gate-bar (M5) is opened up.

Figure 8A:
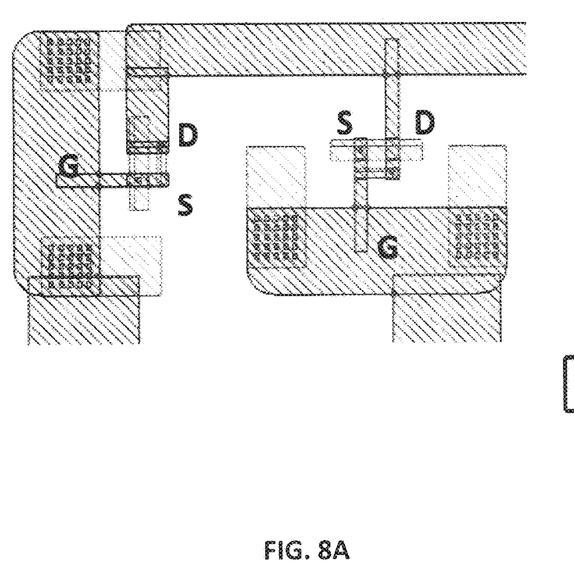
FIG. 8A is a diagram showing details of the layout of two D-mode transistors of the RS-flipflop of FIG. 5A.
Figure 8B:
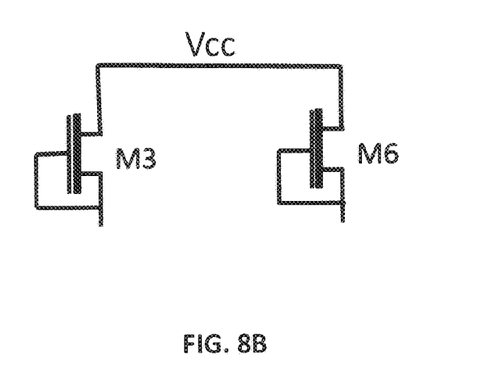
FIG. 8B is the schematic diagram.

FIG. 8A shows a close-up of the layout for the two D-mode HEMTs M3, M6, according to the embodiment of FIG. 5A, and FIG. 8B shows the schematic diagram. Compared to the left side DHEMT M3, the right side DHEMT M6 gate bar (Metal2) is on the right side of the active area and the device is rotated 90 degrees. The rotation leaves sufficient space above the right side DHEMT M6 to allow the Vcc metal layer to pass through and reach both DHEMTs.

For the RS-flipflop to operate, the relative sizes of the device width (as measured by gate (or channel) width) must follow certain ratios. For example, the following ranges of parameters may be used for a 0.5 micron, 6 inch wafer technology: channel width of the main RS-flipflop EHEMTs M2, M5 ranges from 800 to 2000 microns, the channel width of the input EHEMTs M1, M4 ranges from 200 to 500 microns, and that of the DHEMTs M3, M6 ranges from 7-20 microns. Based on this order, the channel widths for the three pairs of transistors may be selected according to a ratio of 100:30:1, wherein the channel width for each pair may vary by plus or minus 50%. This ratio may be used when technology and current driving rate varies.

Figure 9:
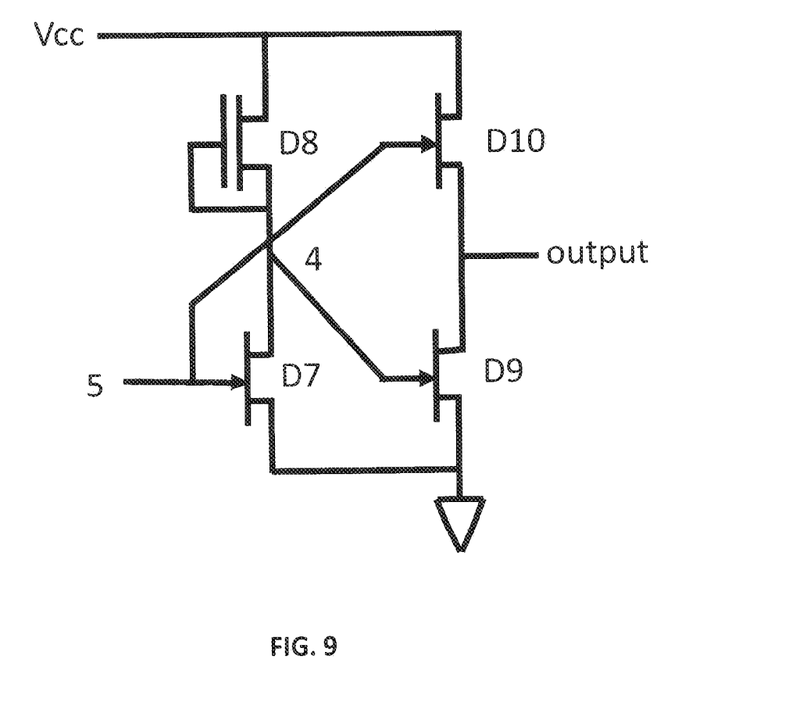
FIG. 9 is a circuit diagram of a direct-coupled FET logic (DCFL) circuit used as an amplifier according to one embodiment.

As described above, the amplifier may be implemented discretely and co-packaged with the GaN IC, or it may be implemented together with at least one of the RS-flipflop and the high-side GaN power switch in a monolithic GaN IC. For a GaN monolithic IC implementation, a direct-coupled FET logic (DCFL) circuit may be used for the amplifier. An example of a suitable design is shown in FIG. 9. Single or multiple stages of the DCFL may be used to achieve a current gain of 50-5,000, depending on driving needs.

It is noted that in prior DCFL designs, the $2^{nd}$ stage high side input is connected as the load of the first stage and the $2^{nd}$ stage low side input is connected to the input of the first stage. However, in the embodiment shown in FIG. 9 the input connections for the $2^{nd}$ stage are opposite those of the prior design. That is, the first stage input point 5 is connected to the gate of D7 and to the second stage high side input point (i.e., the gate of D10), and the first stage output point 4 is connected to the second stage low side input point (i.e., the gate of D9). This is an improvement which achieves a normally off condition for the DCFL amplifier, which is advantageous in power electronics applications.

Figure 10A:
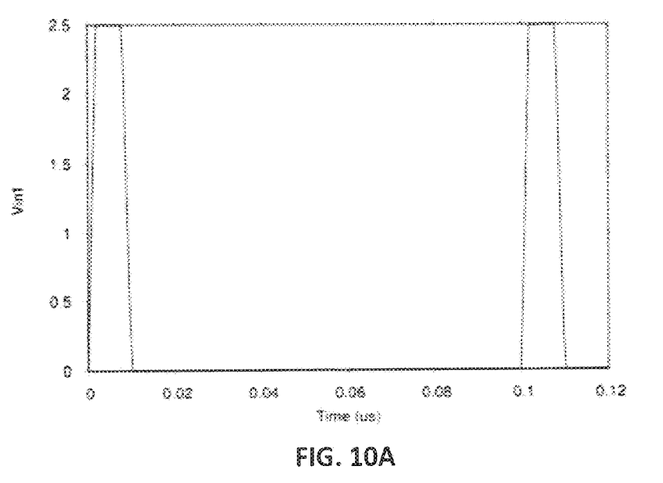
FIGS. 10A and 10B are plots showing two narrow pulse trains from a microcontroller unit (MCU) used to trigger the RS-flipflop of FIG. 5 in a circuit simulation.
Figure 10B:
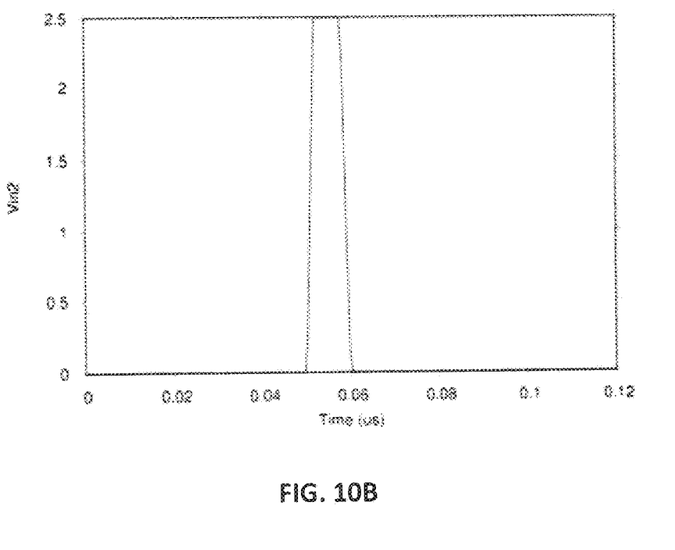
Figure 11:
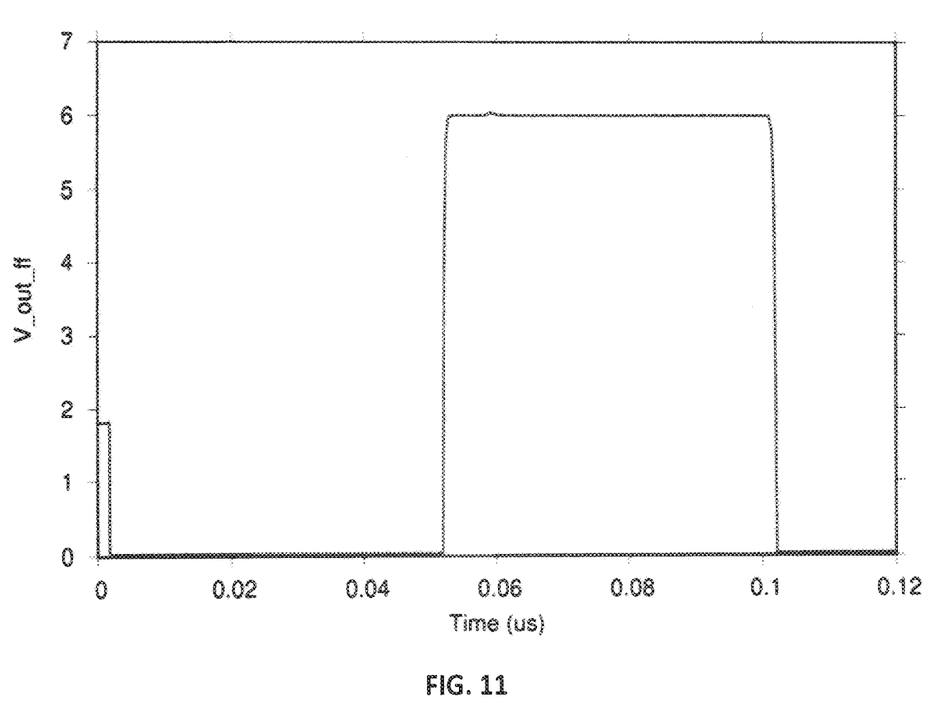
FIG. 11 is a plot showing output of the RS-flipflop of FIG. 5 in a circuit simulation.

A simulation was performed using APSYS™ software (Crosslight Software Inc., Vancouver, Canada; www.crosslight.com) to confirm operation of an embodiment based on the circuit of FIG. 1 and the RS-flipflop layout embodiment of FIG. 5A, using the DCFL amplifier of FIG. 9. FIGS. 10A and 10B show the two input pulse trains based on a pulse width of 10 ns. FIG. 11 shows the simulated output of the RS-flipflop which clearly demonstrates the desired state switching signal.

Figure 12A:
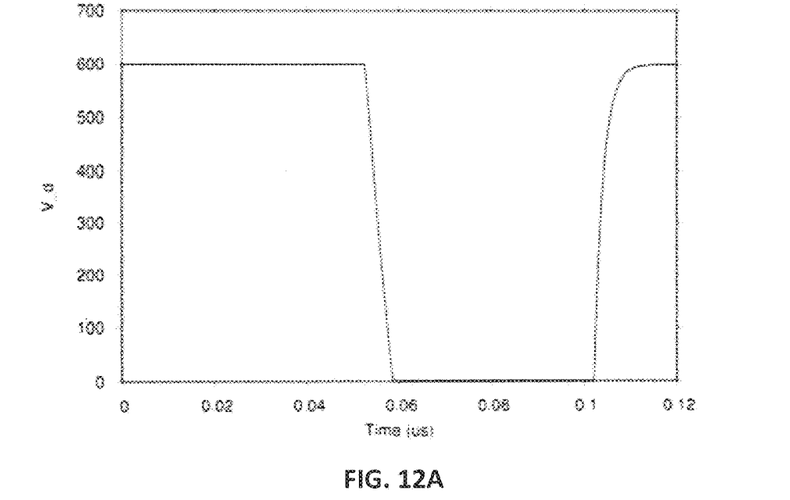
FIGS. 12A and 12B are plots showing output voltage and current, respectively, of the high-side GaN power transistor in a circuit simulation.
Figure 12B:
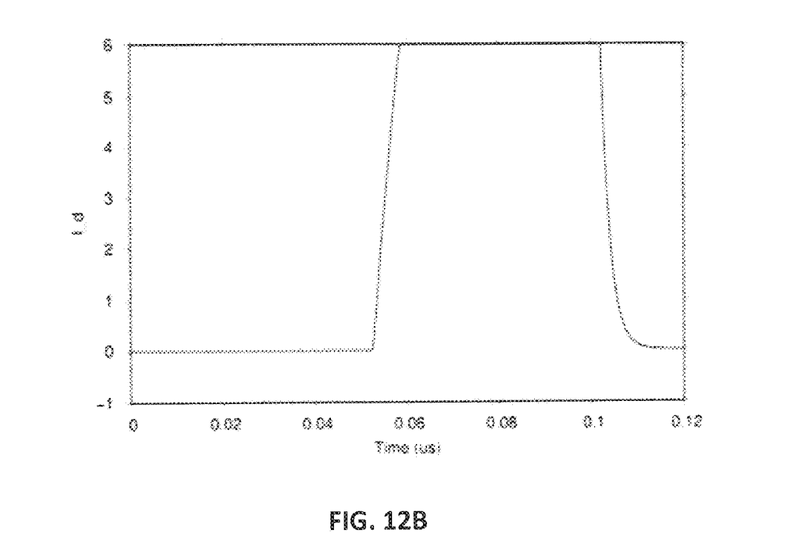
Figure 13:
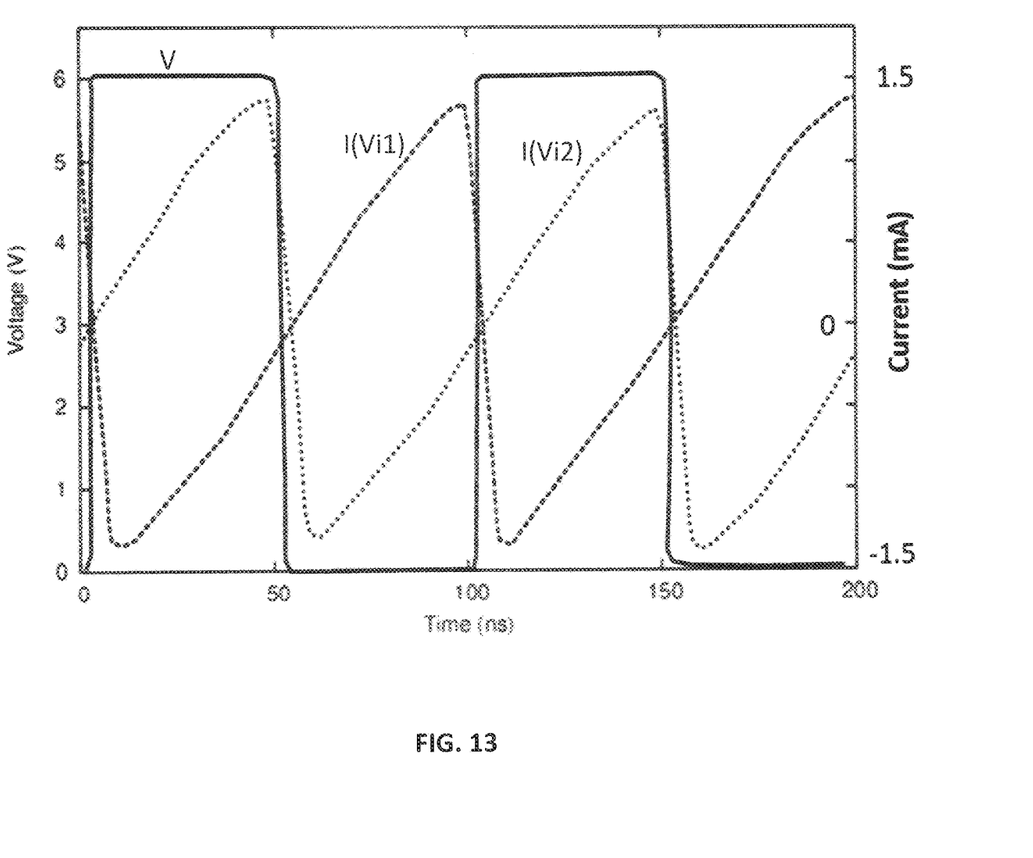
FIG. 13 is a plot shot showing MCU output voltage and current in a simulation of the circuit of FIG. 1.

For simplicity a dummy load of 300 Ohm with a high voltage bias of 600V was placed on the output of the main (i.e., high-side) GaN power transistor (M11), as shown in FIG. 2. The output voltage and current waveforms are shown in FIGS. 12A and 12B, which clearly demonstrate the desired switching of the high-side GaN power transistor M11. FIG. 13 is a plot reproduced from an oscilloscope screen shot showing the MCU output voltage and current in the simulation.

In accordance with the embodiments described herein, the magnetizing inductance of the transformer should be selected large enough so that the magnetizing current is limited to a reasonable level to reduce the total power consumption. The DC blocking capacitors (C1, C2 as shown in FIG. 1) may be selected so that the voltage across them is substantially a DC voltage. In the simulation, C1=C2=0.2 nF and magnetizing inductance of Lmag=7 µH were used. In a practical implementation, other values may of course be used. For example, the values of C1, C2=0.2 nF and Tx1, Tx2=7 µH:7 µH may vary by plus or minus 50% with a pulse width of 10 ns. With the above parameters, the RMS value of the MCU current is limited to below 1 mA, which is within design specifications. It is noted that a micro transformer with primary:secondary windings of 7 µH:7 µH is relatively small and therefore favourable for PCB implementation, resulting in a lower cost than other approaches using a discrete isolator/driver. Use of a narrow pulse width, such as, e.g., 10 ns pulse width, allows small transformers to be used.

EQUIVALENTS

While the invention has been described with respect to illustrative embodiments thereof, it will be understood that various changes may be made to the embodiments without departing from the scope of the invention. Accordingly, the described embodiments are to be considered merely exemplary and the invention is not to be limited thereby.

The invention claimed is:

1. A gate driver circuit for a gallium nitride (GaN) power transistor, comprising:
   a RS-flipflop that receives a first pulse train at an S input terminal and a second pulse train at an R input terminal, and produces an output pulse train;
   a direct-coupled FET logic (DCFL) amplifier that amplifies the output pulse train and produces a gate driver signal for the GaN power transistor;
   wherein the first pulse train and the second pulse train are independently controlled signals;
   wherein the DCFL amplifier comprises:
   a first stage input point, a first stage output point, a second stage high side input point, a second stage low side input point, and an amplifier output point;
   wherein the first stage input point is connected to a first stage and to the second stage high side input point; and
   wherein the first stage output point is connected to the second stage low side input point.

2. The gate driver circuit of claim 1, wherein the RS-flipflop is implemented on a GaN monolithic integrated circuit;
   wherein the RS-flipflop comprises:
   four EHEMTs and two DHEMTs;
   wherein a first two of the EHEMTs are of a large channel width and are arranged back-to-back as main RS-flipflop transistors;
   wherein a second two of the EHEMTs are of a small channel width and are arranged as R and S input transistors;
   wherein the two DHEMTs are configured as non-linear loads for the main RS-flipflop transistors.

3. The gate driver circuit of claim 2, wherein a ratio of transistor channel widths for the two EHEMTs of a large channel width, the two EHEMTs of a small channel width, and the two DHEMTs is (100±50):(30±15):(1±0.5), respectively.

4. The gate driver circuit of claim 2, further comprising a device that outputs the first pulse train and the second pulse train;
   wherein a pulse width of the first pulse train is within a range of about 5 ns to 15 ns; and
   wherein a pulse width of the second pulse train is within a range of about 5 ns to 15 ns.

5. The gate driver circuit of claim 4, further comprising a first transformer that couples the first pulse train to the S input terminal of the RS-flipflop; and
a second transformer that couples the second pulse train to the R input terminal of the RS-flipflop.

6. The gate driver circuit of claim 5, wherein magnetizing inductance ratios for the first transformer and for the second transformer are about (7±3.5) μH:(7±3.5) μH for a 10 ns pulse width.

7. A method for implementing a gate driver circuit for a GaN power transistor, comprising:
using a RS-flipflop to receive a first pulse train at an S input terminal, receive a second pulse train at an R input terminal, and produce an output pulse train;
amplifying the output pulse train to produce a gate driver signal for the GaN power transistor;
wherein the first pulse train and the second pulse train are independently controlled signals;
the method further comprising implementing the RS-flipflop on a GaN monolithic integrated circuit;
wherein the RS-flipflop comprises:
four EHEMTs and two DHEMTs;
wherein a first two of the EHEMTs are of a large channel width and are arranged back-to-back as main RS-flipflop transistors;
wherein a second two of the EHEMTs are of a small channel width and are arranged as R and S input transistors;
wherein the two DHEMTs are configured as non-linear loads for the main RS-flipflop transistors.

8. The method of claim 7, wherein a ratio of transistor channel widths for the two EHEMTs of a large channel width, the two EHEMTs of a small channel width, and the two DHEMTs is (100±50):(30±15):(1±0.5), respectively.

* * * * *